United States Patent
Cho

(10) Patent No.: US 9,436,302 B2
(45) Date of Patent: Sep. 6, 2016

(54) DISPLAY DEVICE INCLUDING TOUCH EMITTING KEY UNIT

(71) Applicant: Samsung Display Co., Ltd., Yongin, Gyeonggi-do (KR)

(72) Inventor: Dai-Han Cho, Yongin (KR)

(73) Assignee: Samsung Display Co., Ltd., Gyeonggi-do (KR)

(*) Notice: Subject to any disclaimer, the term of this patent is extended or adjusted under 35 U.S.C. 154(b) by 153 days.

(21) Appl. No.: 13/691,473

(22) Filed: Nov. 30, 2012

(65) Prior Publication Data

US 2014/0028583 A1 Jan. 30, 2014

(30) Foreign Application Priority Data

Jul. 25, 2012 (KR) ........................ 10-2012-0081405

(51) Int. Cl.
- *G06F 3/041* (2006.01)
- *G06F 1/16* (2006.01)
- *G06F 3/02* (2006.01)
- *H03K 17/96* (2006.01)

(52) U.S. Cl.
CPC ............. *G06F 3/041* (2013.01); *G06F 1/1637* (2013.01); *G06F 3/0202* (2013.01); *H03K 17/9631* (2013.01); *H03K 2217/96015* (2013.01)

(58) Field of Classification Search
CPC ....................................................... G06F 3/041
USPC ......................................................... 345/173
See application file for complete search history.

(56) References Cited

U.S. PATENT DOCUMENTS

| | | | |
|---|---|---|---|
| 2007/0165009 A1* | 7/2007 | Sakurai et al. | 345/177 |
| 2010/0075720 A1 | 3/2010 | Lee et al. | |
| 2010/0253637 A1* | 10/2010 | Lieberman | G06F 3/0421 345/173 |
| 2010/0271329 A1 | 10/2010 | Oohira | |
| 2012/0050195 A1 | 3/2012 | Heo et al. | |
| 2012/0182258 A1* | 7/2012 | Kubo et al. | 345/174 |
| 2012/0276957 A1* | 11/2012 | Yang et al. | 455/566 |
| 2012/0329526 A1* | 12/2012 | Song et al. | 455/566 |

FOREIGN PATENT DOCUMENTS

| | | |
|---|---|---|
| KR | 10-2010-0035059 A | 4/2010 |
| KR | 10-2010-0118081 A | 11/2010 |
| KR | 10-2012-0019543 A | 3/2012 |

* cited by examiner

*Primary Examiner* — Long D Pham
(74) *Attorney, Agent, or Firm* — Knobbe, Martens, Olson & Bear, LLP

(57) ABSTRACT

A display device is disclosed. In one aspect, the device includes a touch emitting key unit, wherein the display device has a structure that a display module and a part of the touch emitting key unit substantially vertically overlap as the touch emitting key unit is affixed to a window. According to the structure, a dead space outside a screen may be effectively reduced.

14 Claims, 2 Drawing Sheets

DISPLAY DEVICE INCLUDING TOUCH
EMITTING KEY UNIT

CROSS-REFERENCE TO RELATED PATENT
APPLICATION

This application claims the benefit of Korean Patent Application No. 10-2012-0081405, filed on Jul. 25, 2012, in the Korean Intellectual Property Office, the disclosure of which is incorporated herein in its entirety by reference.

BACKGROUND

1. Field

The described technology generally relates to a display device, and more particularly, to a display device including a touch emitting key unit for a touch operation by a user.

2. Description of the Related Technology

A display device, such as an organic light-emitting display (OLED) device or a liquid crystal display (LCD) device, includes a display module for displaying an image, a window covering the display module, and a touch emitting key unit where corresponding marks emit light so that a user may perform a touch operation through one surface of the window. Thus, as a screen of the display module is turned on, the touch emitting key unit is also on, and marks for the touch operation appear, then a user may perform a desired operation by touching the corresponding marks. In the case of a general touch-type cell phone, for example, a menu key or a cancel key located at the bottom of the screen corresponds to the marks that are on/off by the touch emitting key unit.

SUMMARY

One inventive aspect is a display device that is improved in effectively reducing a dead space due to a touch emitting key unit.

Another aspect is a display device including a display module including a screen to display an image, a window covering the display module so as to show the screen, and a touch emitting key unit emitting marks for a touch operation through one surface of the window, wherein the touch emitting key unit is affixed to the window.

A part of the touch emitting key unit and the display module may vertically overlap on a layout viewed through the window.

The touch emitting key unit may include a light source; a mark pattern part marked with marks; and a reflection plate reflecting the light from the light source toward the mark pattern part.

The touch emitting key unit may further include a flexible printed circuit board (FPCB) loaded with the light source to be attached to the window.

One terminal of the reflection plate may be affixed to the light source, and the other terminal is affixed to the FPCB.

A light guide plate may be further included between the mark pattern part and the reflection plate.

The light source may include a light-emitting diode (LED).

A shading layer that shades other areas than an area for displaying an image, may be formed on an area of the window where the touch emitting key unit is installed.

A protective film may be formed on the shading layer.

An accommodating groove is formed in the window, and the touch emitting key unit may be affixed by being installed in the accommodating groove.

DETAILED DESCRIPTION

A touch emitting key unit for a display device is generally disposed next to a display module, and thus, an overall length of the display device increases. That is, the display module and the touch emitting key unit are installed side-by-side in a set housing where the window is to be coupled, thus an occupancy space of the display module and an occupancy space of the touch emitting key unit also need to be obtained side-by-side, and accordingly, a length of the set housing increases, and a length of the window that couples to the set housing is also increased. If, the display device is enlarged due to the lengthened screen of the display module, there is no problem since a large screen is realized. However, if the display device is enlarged due to the touch emitting key unit, it is not desirable since a dead space outside the screen is enlarged. Therefore, a method to reduce a dead space of a display device while including a touch emitting key unit is desired.

Hereinafter, embodiments will be described in detail with reference to the attached drawings.

Figure 1:
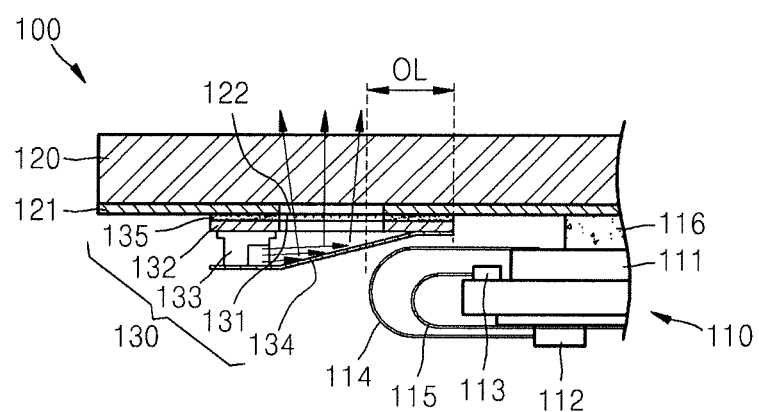
FIG. 1 is a cross-sectional view of a display device according to an embodiment.

FIG. 1 illustrates a display device 100 according to an embodiment. As shown in FIG. 1, the display device 100 of the current embodiment includes a display module 110 displaying an image through a screen, a window 120 covering the display module 110 so as to show the screen, and a touch emitting key unit 130 emitting marks for a touch operation through one surface of the window 120.

First, the display module 110 includes a display panel 111 where an image is displayed, a plurality of driving chips 112 and 113 installed on the display panel 111, and flexible printed circuit boards (FPCBs) 114 and 115 connecting the driving chips 112 and 113 to the display panel 111. Although not shown in FIG. 1, the display module 110 is installed on a set housing, and the window 120 is coupled with the set housing so as to show the screen of the display module 110. The reference numeral 116 denotes an adhesive resin that is applied so that the window 120 may also be attached to the display module 110 when the window 120 is coupled with the set housing (not shown).

The window 120 is coupled to the set housing (not shown), as mentioned above, thus covers the display module 110 so as to show the screen, and a shading layer 121 that shades other areas than an area for displaying an image, is applied on an inner surface of the window 120. The shading layer 121 may be formed of a black matrix.

Also, the touch emitting key unit 130 displays an image by emitting the marks for a touch operation through a transparent part 122 defined in the shading layer 121 (See FIG. 1). The touch emitting key unit 130 includes a mark pattern part 131, a light source 133 such as a light-emitting diode (LED), a reflection plate 134 that reflects light from the light source 133 toward the mark pattern part 131, and a FPCB 132 loaded with the light source 133 so that the light source 133 may be attached to the window 120. One terminal of the reflection plate 134 is affixed to the light source 133, and the other terminal is affixed to the FPCB 132, and thus, the reflection plate 134 may have a slope, and the light from the light source 133 may be guided toward the mark pattern part 131 by the slope of the reflection plate 134. The reference numeral 135 denotes a light-blocking type double-sided tape for attaching the FPCB 132 to the window 120, and the mark pattern part 131 is also attached to the window 120. Thus, when the light source 133 emits light, the light is reflected from the reflection plate 134 and output through the mark pattern part 131, and accordingly, the marks (not shown) of the mark pattern part 131 are displayed to enable an operation by a user.

In addition, as shown in FIG. 1, the touch emitting key unit 130 is affixed to the window 120. That is, the touch emitting key unit 130 is not installed on the set housing (not shown) and disposed next to the display module 110, rather than that the touch emitting key unit 130 is affixed to the window 120, so that the display module 110 and a partial region OL are disposed substantially vertically overlapping each other. Such a structure may be effective in reducing a dead space of the display device 100. If the touch emitting key unit 130 is disposed next to the display module 110, a total length of the summed length of an occupancy space of the display module 110 and an occupancy space of the touch emitting key unit 130 needs to be retained in the display device 100, and consequently, an area of the dead space outside the screen of the display module needs to be enlarged as much. However, if the touch emitting key unit 130 is affixed to the window 120 in the same manner as the current embodiment so that the display module 110 and the partial region OL substantially vertically overlap each other, a length of a dead space may be reduced by as much of the overlapped partial region OL. Therefore, unnecessary enlargement of a dead space may be effectively suppressed by the structure of the current embodiment.

Thus, the display device 100 with an effectively reduced length of a dead space may be implemented by separately installing the display module 110 forming an image and the touch emitting key unit 130 displaying the marks for a touch operation on the set housing (not shown) and the window 120, respectively, and disposing the partial region OL to substantially vertically overlap on a layout viewed through the window 120.

Figure 2:
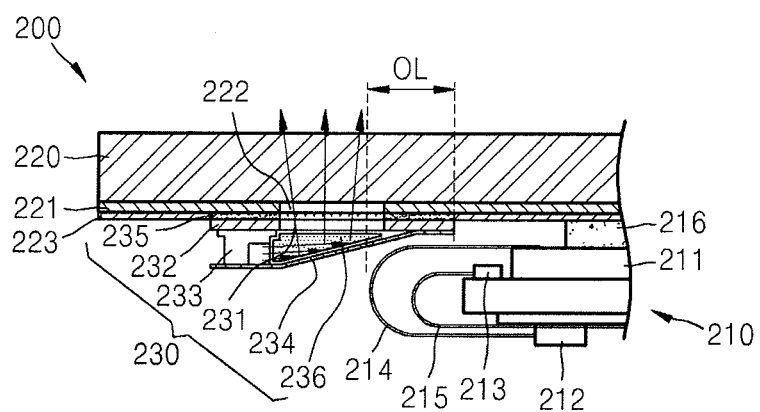
FIG. 2 is a cross-sectional view of a display device according to another embodiment.

Next, FIG. 2 illustrates a display device 200 according to another embodiment.

The display device 200 of the current embodiment also includes a display module 210 forming an image through a screen, a window 220 covering the display module 210 so as to show the screen, and a touch emitting key unit 230 emitting marks for a touch operation through one surface of the window 220.

First, the display module 210 includes a display panel 211 where an image is displayed, a plurality of driving chips 212 and 213 installed on the display panel 211, and flexible printed circuit boards (FPCBs) 214 and 215 connecting the driving chips 212 and 213 to the display panel 211. Although not shown in FIG. 2, the display module 210 is installed on a set housing, and the window 220 is coupled with the set housing so as to show the screen of the display module 210. The reference numeral 216 denotes an adhesive resin that is applied so that the window 220 may also be attached to the display module 210 when the window 220 is coupled with the set housing (not shown).

The window 220 is coupled to the set housing (not shown), as mentioned above, thus covers the display module 210 so as to show the screen, and a shading layer 221 that shades other areas than an area for displaying an image, is applied on an inner surface of the window 220. The shading layer 221 may be formed of a black matrix. The reference numeral 223 denotes a protective film of a polyethylene tetraphthalate (PET) material which reduces a damage risk of the window 220 and serves to improve a texture of the shading layer 221. That is, a texture of black color may appear vividly and clearly by applying the shading layer 221 to the protective film 223 first and then attaching the protective film 223 to the window 220.

Also, as shown in FIG. 2, the touch emitting key unit 230 displays an image by emitting the marks for a touch operation through a transparent part 222 formed in the shading layer 221. The touch emitting key unit 230 includes a mark pattern part 231, a light source 233 such as a LED, a reflection plate 234 that reflects light from the light source 233 toward the mark pattern part 231, and a FPCB 232 loaded with the light source 230 so that may be attached to the window 220. The reference numeral 235 denotes a light-blocking type double-sided tape for attaching the FPCB 232 to the window 220, and the mark pattern part 231 is also attached to the window 220. Moreover, according to the current embodiment, a light guide plate 236 is further included between the reflection plate 234 and the mark pattern part 231 in the display device 200 unlike the embodiment previously described above. That is, in the embodiment previously described above, light from the light source 233 is only reflected from the reflection plate 234 and induced toward the mark pattern part 231, but in the current embodiment, light from the light source 233 is induced by being guided through the light guide plate 236 as well as the reflection plate 234 toward the mark pattern part 231. When the light guide plate 236 is included, the light of the light source 233 may be uniformly induced throughout an entire surface of the mark pattern part 231.

Thus, when the light source 233 emits light, the light is reflected from the reflection plate 234 and guided by the light guide plate 236 to be output through the mark pattern part 231, and accordingly, the marks (not shown) of the mark pattern part 231 are displayed to enable an operation by a user.

Moreover, the touch emitting key unit 230 is also affixed to the window 220 in the current embodiment. That is, the touch emitting key unit 230 is affixed to the window 220, so that the display module 210 and a partial region OL are disposed substantially vertically overlapping each other. As the display module 210 and the partial region OL are disposed substantially vertically overlapping each other, a length of a dead space may be reduced by as much of the overlapped partial region OL, and accordingly, unnecessary enlargement of a dead space may be effectively suppressed by the structure of the current embodiment.

Thus, the display device 200 with an effectively reduced length of a dead space may be also implemented in the current embodiment by separately installing the display module 210 forming an image and the touch emitting key unit 230 displaying the marks for a touch operation to the set housing (not shown) and the window 220, respectively, and disposing the partial region OL to substantially vertically overlap on a layout viewed through the window 220.

Figure 3:
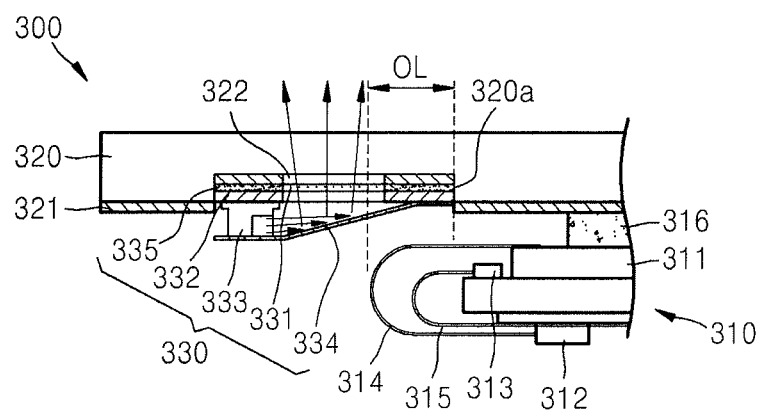
FIG. 3 is a cross-sectional view of a display device according to another embodiment.

Next, FIG. 3 illustrates a display device 300 according to another embodiment.

The display device 300 of the current embodiment also includes a display module 310 forming an image through a screen, a window 320 covering the display module 310 so as to show the screen, and a touch emitting key unit 330 emitting marks for a touch operation through one surface of the window 320.

First, the display module 310 includes a display panel 311 where an image is displayed, a plurality of driving chips 312 and 313 installed on the display panel 311, and flexible printed circuit boards (FPCBs) 314 and 315 connecting the driving chips 312 and 313 to the display panel 311. Although not shown in FIG. 3, the display module 310 is installed on a set housing, and the window 320 is coupled with the set housing so as to show the screen of the display module 310. The reference numeral 316 denotes an adhesive resin that is applied so that the window 320 may also be attached to the display module 310 when the window 320 is coupled with the set housing (not shown).

The window 320 is coupled to the set housing (not shown), as mentioned above, thus covers the display module 310 so as to show the screen, and a shading layer 321 that shades other areas than an area for displaying an image, is applied on an inner surface of the window 320. The shading layer 321 may be formed of a black matrix. Also, as shown in FIG. 3, an accommodating groove 320a is formed in the window 320 in which a part of the touch emitting key unit 330 in the window 320 is disposed. That is, the accommodating groove 320a is engraved inside the window 320, and a part of the touch emitting key unit 330 is affixed in the accommodating groove 320a. If the touch emitting key unit 330 is installed in the accommodating groove 320a in such a manner, a height of the touch emitting key unit 330 protruding downward from the window 320 is reduced, and thus, a vertical gap with the display module 310 may be reduced, and accordingly, the produced display device 300 may be slimmed.

Also, the touch emitting key unit 330 displays an image by emitting the marks for a touch operation through a transparent part 322 in between the shading layer 321. The touch emitting key unit 330 includes a mark pattern part 331, a light source 333 such as a LED, a reflection plate 334 that reflects light from the light source 333 toward the mark pattern part 331, and a FPCB 332 loaded with the light source 330 so that the light source 333 may be attached to the window 320. The reference numeral 335 denotes a light-blocking type double-sided tape for attaching the FPCB 332 to the window 320, and the mark pattern part 331 is also attached to the window 320.

Thus, when the light source 333 emits light, the light is guided by the reflection plate 334 to be output through the mark pattern part 331, and accordingly, the marks (not shown) of the mark pattern part 331 are displayed to enable an operation by a user.

Moreover, the touch emitting key unit 330 is also affixed to the window 320 in the current embodiment. That is, the touch emitting key unit 330 is affixed to the window 320, so that the display module 310 and a partial region OL are disposed substantially vertically overlapping each other. As the display module 310 and the partial region OL are disposed substantially vertically overlapping each other, a length of a dead space may be reduced by as much of the overlapped partial region OL, and accordingly, unnecessary enlargement of a dead space may be effectively suppressed by the structure of the current embodiment.

Thus, the display device 300 with an effectively reduced length of a dead space may be also implemented in the current embodiment by separately installing the display module 310 forming an image and the touch emitting key unit 330 displaying the marks for a touch operation on the set housing (not shown) and the window 320, respectively, and disposing the partial region OL to substantially vertically overlap on a layout viewed through the window 320. Also, in the current embodiment, the touch emitting key unit 330 is installed in the accommodating groove 320a of the window 320, thus the display device 300 may be conveniently slimmed.

Figure 4:
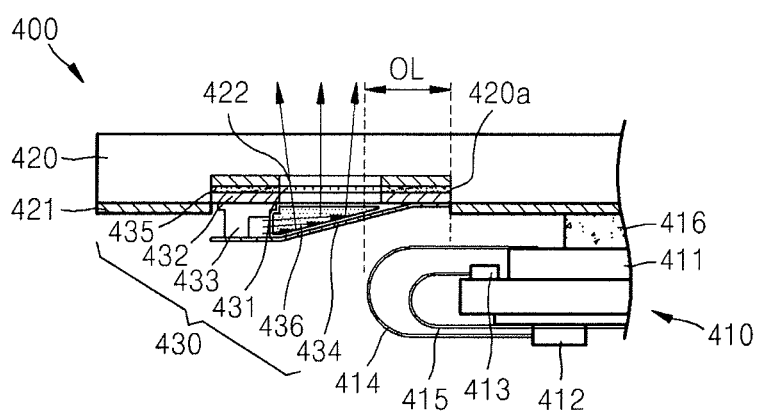
FIG. 4 is a cross-sectional view of a display device according to another embodiment.

Next, FIG. 4 illustrates a display device 400 according to another embodiment.

The display device 400 of the current embodiment also includes a display module 410 forming an image through a screen, a window 420 covering the display module 410 so as to show the screen, and a touch emitting key unit 430 emitting marks for a touch operation through one surface of the window 420.

First, the display module 410 includes a display panel 411 where an image is displayed, a plurality of driving chips 412 and 413 installed on the display panel 411, and flexible printed circuit boards (FPCBs) 414 and 415 connecting the driving chips 412 and 413 to the display panel 411. Although not shown in FIG. 4, the display module 410 is installed on a set housing, and the window 420 is coupled with the set housing so as to show the screen of the display module 410. The reference numeral 416 denotes an adhesive resin that is applied so that the window 420 may also be attached to the display module 410 when the window 420 is coupled with the set housing (not shown).

The window 420 is coupled to the set housing (not shown), as mentioned above, thus covers the display module 410 so as to show the screen, and a shading layer 421 that shades other areas than an area for displaying an image, is applied on an inner surface of the window 420. The shading layer 421 may be formed of a black matrix. Also, an accommodating groove 420a is formed in the window 420 in which a part of the touch emitting key unit 430 in the window 420 is disposed. That is, the accommodating groove 420a is engraved inside the window 420, and a part of the touch emitting key unit 430 is affixed in the accommodating groove 420a. If the touch emitting key unit 430 is installed in the accommodating groove 420a in such a manner, a height of the touch emitting key unit 430 protruding downward from the window 420 is reduced, and thus, a vertical gap with the display module 410 may be reduced, and accordingly, the produced display device 400 may be slimmed.

Also, the touch emitting key unit 430 displays an image by emitting the marks for a touch operation through a transparent part 422 in between the shading layer 421. The touch emitting key unit 430 includes a mark pattern part 431, a light source 433 such as a LED, a reflection plate 434 that reflects light from the light source 433 toward the mark pattern part 431, and a FPCB 432 loaded with the light source 430 so that the light source 433 may be attached to the window 420. The reference numeral 435 denotes a light-blocking type double-sided tape for attaching the FPCB 432 to the window 420, and the mark pattern part 431 is also attached to the window 420.

Moreover, according to the current embodiment, a light guide plate 436 is further included between the reflection plate 434 and the mark pattern part 431 in the touch emitting key unit 430. That is, in the current embodiment, light from the light source 433 is induced by being guided through the light guide plate 436 as well as the reflection plate 434 toward the mark pattern part 431. When the light guide plate 436 is included, the light of the light source 433 may be uniformly induced throughout an entire surface of the mark pattern part 431.

Thus, when the light source 433 emits light, the light is reflected from the reflection plate 434 and guided by the light guide plate 436 to be output through the mark pattern part 431, and accordingly, the marks (not shown) of the mark pattern part 431 are displayed to enable an operation by a user.

Moreover, the touch emitting key unit 430 is also affixed to the window 420 in the current embodiment. That is, the touch emitting key unit 430 is affixed to the window 420, so that the display module 410 and a partial region OL are disposed substantially vertically overlapping each other. As the display module 410 and the partial region OL are disposed substantially vertically overlapping each other, a length of a dead space may be reduced by as much of the overlapped partial region OL, and accordingly, unnecessary enlargement of a dead space may be effectively suppressed by the structure of the current embodiment.

Thus, the display device 400 with an effectively reduced length of a dead space may be also implemented in the current embodiment by separately installing the display module 410 forming an image and the touch emitting key unit 430 displaying the marks for a touch operation to the set housing (not shown) and the window 420, respectively, and disposing the partial region OL to substantially vertically overlap on a layout viewed through the window 420. Also, in the current embodiment, the touch emitting key unit 430 is installed in the accommodating groove 420a of the window 420, thus the display device 400 may be conveniently slimmed.

While the above embodiments have been described with reference to the accompanying drawings, it will be understood by those of ordinary skill in the art that various changes in form and details may be made therein without departing from the spirit and scope of the present disclosure as defined by the following claims.

What is claimed is:

1. A display device comprising:
a display module comprising a screen, wherein the screen is configured to display an image, wherein the display module further comprises at least one driving chip;
a window covering the display module so as to show the screen; and
a touch emitting key unit configured to emit marks for a touch operation through one surface of the window,
wherein the touch emitting key unit is affixed to the window, wherein at least a portion of the touch emitting key unit is interposed between the display module and the window, and wherein the portion of the touch emitting key unit and the driving chip do not overlap each other in the depth dimension of the display device, wherein the touch emitting key unit comprises a light source, a reflection plate configured to reflect the light from the light source and a flexible printed circuit board (FPCB) attached to the window, wherein the light source is disposed on the FPCB, wherein the reflection plate is inclined with respect to the window and contacts the light source,
wherein the reflection plate includes first and second ends opposing each other, wherein the FPCB includes first and second surfaces opposing each other, wherein the first surface of the FPCB faces the window, and wherein the second surface of the FPCB is in direct physical contact with both the light source and the first end of the reflection plate.

2. The display device of claim 1, wherein the portion of the touch emitting key unit and the FPCB overlap each other in the depth dimension of the display device.

3. The display device of claim 1, wherein the touch emitting key unit further comprises a mark pattern part marked with marks configured to pass the light reflected from reflection plate therethrough.

4. The display device of claim 3, further comprising a light guide plate disposed between the mark pattern part and the reflection plate.

5. The display device of claim 3, wherein the light source comprises a light-emitting diode (LED).

6. The display device of claim 1, wherein the reflection plate has two opposing ends, wherein one end of the reflection plate is affixed to the light source, and wherein the other end is affixed to the FPCB.

7. The display device of claim 1, further comprising a shading layer formed on an area of the window where the touch emitting key unit is installed, wherein the shading layer is configured to shade an area except for an image display area.

8. The display device of claim 7, further comprising a protective film formed on the shading layer.

9. The display device of claim 1, wherein an accommodating groove is formed in the window and accommodates the touch emitting key unit therein.

10. The display device of claim 1, wherein the display module further comprises a second flexible printed circuit board (FPCB) attached to the screen, wherein the portion of the touch emitting key unit and the FPCB overlap each other in the depth dimension of the display device, and wherein the portion of the touch emitting key unit and the screen do not overlap each other in the depth dimension of the display device.

11. The display device of claim 1, wherein the reflection plate includes first and second terminals substantially parallel to the window and an inclined portion interconnecting the first and second terminals, wherein the first terminal of the reflection plate contacts the FPCB and wherein the second terminal of the reflection plate contacts the light source.

12. The display device of claim 11, further comprising an adhesive layer attaching the FPCB to the window.

13. The display device of claim 12, further comprising a shading layer formed between the adhesive layer and the window and configured to shade an area except for an image display area.

14. The display device of claim 1, wherein the second end of the reflection plate is in direct physical contact with the light source.

* * * * *